United States Patent
Mangtani

[11] Patent Number: 5,969,964
[45] Date of Patent: Oct. 19, 1999

[54] RESISTOR IN SERIES WITH BOOTSTRAP DIODE FOR MONOLITHIC GATE DRIVER DEVICE

[75] Inventor: Vijay Mangtani, Playa Del Rey, Calif.

[73] Assignee: International Rectifier Corporation, El Segundo, Calif.

[21] Appl. No.: 09/063,069

[22] Filed: Apr. 21, 1998

Related U.S. Application Data

[60] Provisional application No. 60/044,160, Apr. 23, 1997.

[51] Int. Cl.$^6$ .......................... H02M 7/5387; H02M 1/08
[52] U.S. Cl. ................................ 363/132; 363/56; 363/98
[58] Field of Search .................................. 363/17, 39, 55, 363/56, 97, 98, 131, 132, 133, 134

[56] References Cited

U.S. PATENT DOCUMENTS

| | | | |
|---|---|---|---|
| 5,218,523 | 6/1993 | Sugishima | 363/132 |
| 5,455,758 | 10/1995 | Pelly | 363/134 X |
| 5,706,189 | 1/1998 | Majumdar et al. | 363/132 X |

*Primary Examiner*—Robert E. Nappi
*Assistant Examiner*—Y. J. Han
*Attorney, Agent, or Firm*—Ostrolenk, Faber, Gerb & Soffen, LLP

[57] ABSTRACT

A power circuit includes at least a high side and low side MOS gated transistor operable to form a bridge circuit across high and low power terminals of a power source; a high side driver circuit having an output operable to change conduction characteristics of the high side MOS gated transistor; and a series coupled diode and capacitor configured in a bootstrap arrangement with the high side and low side transistors to provide an operating voltage to the high side driver circuit. A low side driver circuit has an output operable to change conduction characteristics of the low side MOS gated transistor; a low side voltage source is coupled to the low side driver circuit to provide an operating voltage thereto, the series coupled diode and capacitor being in series with the low side voltage source; and a stray inductance is located in series with the high side and low side MOS gated transistors and inducing a current through the low side MOS gated transistor in response to conduction changes in the high side and low side MOS gated transistors. A first current limiting element is coupled in series between the low side voltage source and the diode to reduce a component of the induced current from the stray inductance from flowing through the diode into the capacitor; and a second current limiting element is operable to be coupled in series between the low power terminal and the low side voltage source to reduce a component of the induced current from the stray inductance from flowing through the diode into the capacitor.

17 Claims, 3 Drawing Sheets

RESISTOR IN SERIES WITH BOOTSTRAP DIODE FOR MONOLITHIC GATE DRIVER DEVICE

CROSS REFERENCE TO RELATED APPLICATIONS

This application is based on and claims priority to U.S. Provisional Patent Application No. 60/044,160, filed Apr. 23, 1997 entitled RESISTOR IN SERIES WITH BOOTSTRAP DIODE FOR MONOLITHIC GATE DRIVER DEVICE.

This application is related to U.S. patent application No. 08/728,309, filed Oct. 9, 1996, entitled HIGH VOLTAGE DRIVERS WHICH AVOID −VS FAILURE MODES.

BACKGROUND OF THE INVENTION

1. Field of the Invention

The present invention relates to a gate driver for a transistor bridge circuit and, more particularly, relates to a high voltage gate driver employing current limiting elements for reducing the deleterious effects of voltage spikes resulting from transistor switch commutation into inductive loads.

2. Related Art

Reference is made to FIG. 1 which shows a typical half bridge power conversion circuit employing two series coupled transistors Q1, Q2 connected across a source of high voltage +Hv, −Hv. In this case, the transistors Q1, Q2 are insulated gate bipolar transistors (IGBTs) each including an anti-parallel diode D1, D2, respectively, coupled thereacross. The IGBT Q1 is typically referred to as the "high side" transistor (or switch) and the IGBT Q2 is typically referred to as the "low side" transistor (or switch).

As is the case in practical circuits, an amount of stray inductance, Ls, exists between the series coupled IGBTs Q1, Q2, where Ls may be undesirably introduced due to interconnections within the IGBT Q1, Q2 packages and/or due to printed circuit board runs.

The node U (between the IGBTs Q1, Q2) is coupled to a load (not shown) such that current may be delivered to and received from the load as is known in the art.

As shown, a high voltage driver circuit (or "driver") is used to alternately bias the IGBT Q1 and the IGBT Q2 on and off in response to a control signal (for example, a pulse width modulation signal, not shown). The high voltage driver circuit includes first and second gate driver circuits, Drv1 and Drv2, respectively, for providing bias current to the gates of Q1 and Q2. Gate resistors, Rg1 and Rg2 may be included to insure proper turn on and turn off characteristics of the IGBTs Q1, Q2.

The high voltage gate driver circuit obtains operating voltage from a DC supply, Vcc, where the low side driver, Drv2, obtains operating voltage directly from Vcc and the high side driver, Drv1, obtains operating voltage through a bootstrap circuit. The bootstrap circuit includes a bootstrap diode, Dbs, coupled at its anode to Vcc and at its cathode to one end of a bootstrap capacitor, Cbs as is known. The other end of Cbs is connected to node U. Thus, Drv1 obtains its operating voltage across Cbs.

A shunt resistor Rs may be included between the −Hv node and the Vss terminal of the high voltage gate driver circuit.

The high voltage gate driver circuit may be a "junction isolated" device, which devices include a substrate diode, Dsub, as shown. Junction isolated high voltage gate driver circuits may be obtained from the International Rectifier Corporation (El Segundo, Calif.) under the IR21XX series, IR22XX series and other part numbers. Alternatively, the high voltage gate driver circuit may be a "dielectric isolated" device, which devices do not include a substrate diode. Dielectric isolated high voltage gate driver circuits may also be obtained from the International Rectifier Corporation.

When the half bridge circuit of FIG. 1 drives an inductive load several problems are likely to result. Specifically, when the IGBT Q1 changes state (from biased on to biased off), the current through Q1 (collector to emitter) falls at a rate of −di/dt. Since the load is inductive, the current flowing through the load will freewheel through diode D2. The current in D2 (from anode to cathode) will thus ramp up at a rate of di/dt.

The ramping current (di/dt) in D2 must flow through Ls, which ramping current causes a voltage spike, Vls, to develop across Ls having a polarity shown. Vls may be expressed in terms of the ramping current through D2 as follows: Vls=Ls·di/dt.

It is noted that Vls may also be induced when a short circuit shut down occurs at a time when Q2 is sinking current from the load. As will be discussed in detail below, the voltage spike, Vls, is undesirable.

Since diode D2 has a substantially constant forward voltage drop, Vd2 (approximately 0.5 to 0.7 volts), the voltage Vs is driven below −Hv in response to the voltage spike Vls. Indeed, Vs may be described by the following equation: Vs=Vd2−Vls (where the magnitude of Vls is typically much greater than Vd2).

When the high voltage gate driver circuit is of the junction isolated type (i.e., includes a substrate diode, Dsub), a voltage spike Vls will tend to induce a current, Isub, to flow through the substrate diode Dsub. Specifically Isub would tend to flow from Ls, through D2, through Dsub, and through Cbs back to Ls. If Isub is sufficiently high, the driver may malfunction (e.g., latch up) which could result in catastrophic circuit failure (i.e., failure of Q1, Q2, and/or the load, etc.). In addition, Isub current flow causes the Cbs voltage (Vbs) to charge higher which could damage the high side driver Drv1 (possibly also causing catastrophic circuit failure).

When the high voltage gate driver circuit is of the junction isolated type or the dielectric isolation type, a voltage spike Vls across Ls will tend to induce extra current flow through the bootstrap diode, Dbs. Specifically, current would tend to flow from Ls, through D2, through Rs, through Vcc, through Dbs, and through Cbs back to Ls. Typically, the current induced by Vls through Dbs is higher than Isub because Vcc and Vls are in and additive configuration. Consequently, Vbs increases which could damage the high side driver Drv1 (possibly also causing catastrophic circuit failure).

Although the circuit shown in FIG. 1 is a half bridge circuit, similar voltage spikes occur in single phase full bridge power circuits, three phase full bridge circuits, high side chopper circuits, and the like.

While the prior art circuit of FIG. 1 is suitable for use with smaller power semiconductor die sizes, such as up to International Rectifier die size 3, it is not satisfactory at higher dies sizes, such as International Rectifier die size 4 and above.

Accordingly, there is a need in the art for a high voltage gate driver circuit configuration which overcomes the disadvantages of the prior art by mitigating against the deleterious effects of a stray inductance voltage spike occurring in a switching power circuit.

SUMMARY OF THE INVENTION

In order to overcome the disadvantages of the prior art, the power conversion circuit of the present invention includes at least a high side and low side MOS gated transistor operable to form a bridge circuit across high and low power terminals of a power source; a high side driver circuit having an output operable to change conduction characteristics of the high side MOS gated transistor; and a series coupled diode and capacitor configured in a bootstrap arrangement with the high side and low side transistors to provide an operating voltage to the high side driver circuit.

The power circuit also includes a low side driver circuit having an output operable to change conduction characteristics of the low side MOS gated transistor; a low side voltage source coupled to the low side driver circuit to provide an operating voltage thereto, the series coupled diode and capacitor being in series with the low side voltage source; and a stray inductance located in series with the high side and low side MOS gated transistors and inducing a current through the low side MOS gated transistor in response to conduction changes in the high side and low side MOS gated transistors.

The power circuit also includes a first current limiting element coupled in series between the low side voltage source and the diode to reduce a component of the induced current from the stray inductance from flowing through the diode into the capacitor; and a second current limiting element operable to be coupled in series between the low power terminal and the low side voltage source to reduce a component of the induced current from the stray inductance from flowing through the diode into the capacitor.

Other features and advantages of the present invention will become apparent from the following description of the invention which refers to the accompanying drawings.

BRIEF DESCRIPTION OF THE DRAWING

For the purpose of illustrating the invention, there is shown in the drawing a form which is presently preferred, it being understood, however, that the invention is not limited to the precise arrangement and instrumentality shown.

DETAILED DESCRIPTION OF THE INVENTION

Figure 1:
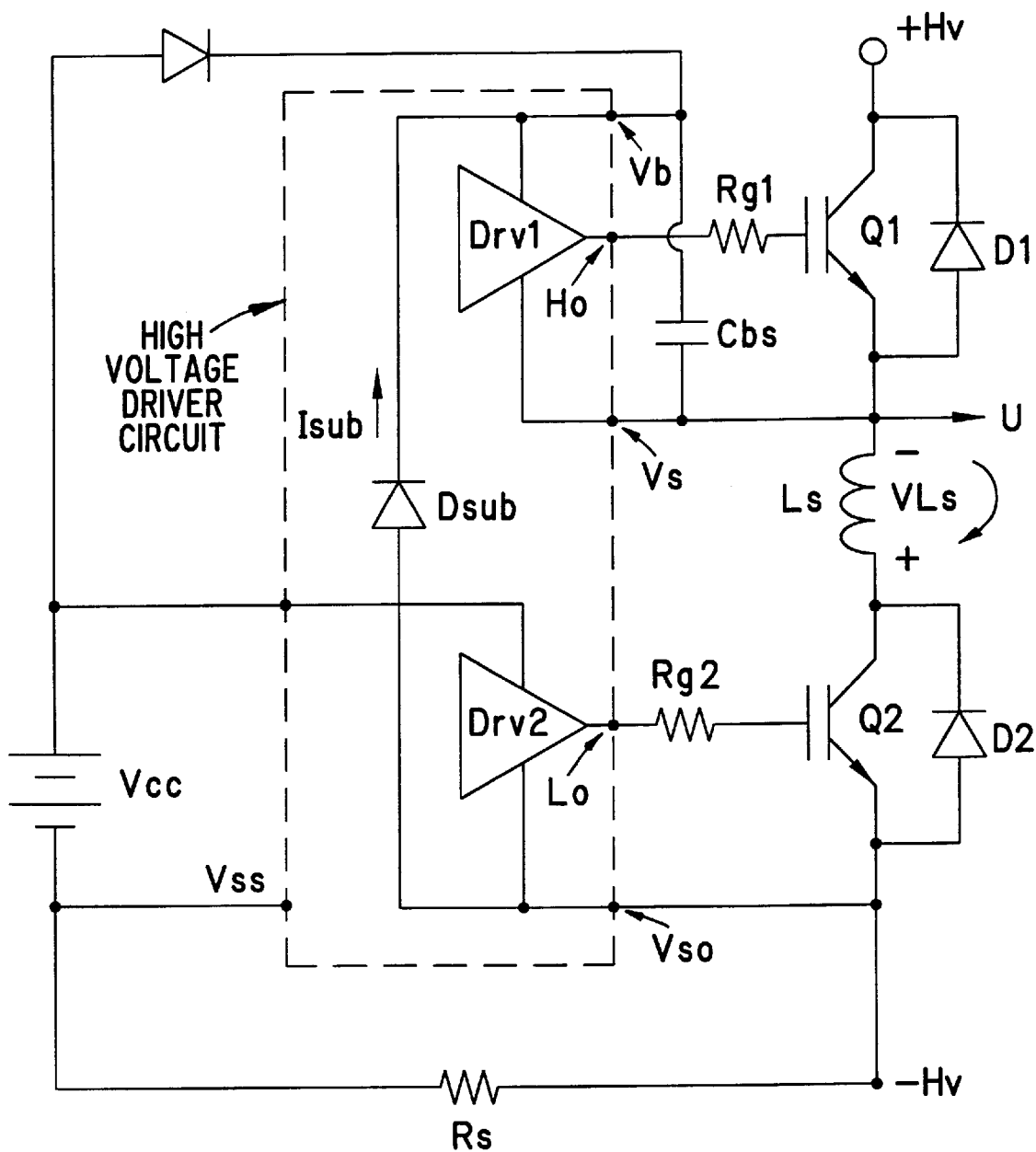
FIG. 1 is a schematic diagram showing a half bridge power circuit of the prior art for driving a load.
Figure 2:
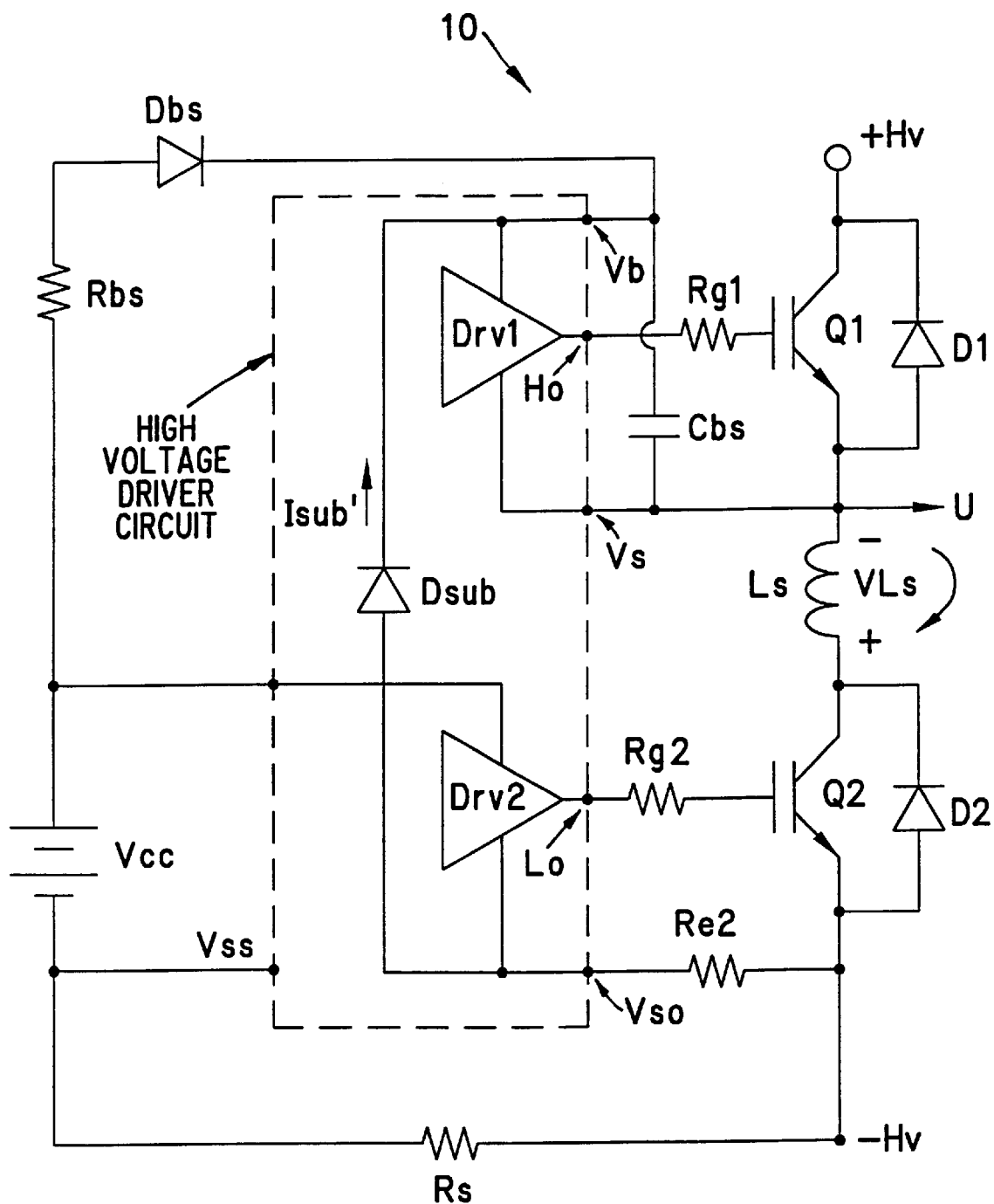
FIG. 2 is a schematic diagram showing a half bridge power circuit employing current limiting resistors in accordance with the preferred embodiment of the present invention.

Referring now to the drawings wherein like numerals indicate like elements, there is shown in FIG. 2 a half bridge power conversion circuit 10 substantially similar to the half bridge circuit of FIG. 1. except that current limiting elements (preferably resistors) Rbs and Re2 are included.

Specifically, a first current limiting element, Rbs, is included in series connection with Dbs to limit the current flow induced by Vls. Rbs is preferably chosen such that Rbs·Cbs>>t1, where t1 is the period of time when the current is ramping up in D2 at the rate of di/dt. It is noted, however, that Rbs has an upper limit which is dictated by the charging requirement of Cbs during normal operation. In an application using the IRPT2056C high voltage gate driver circuit (obtainable from the International Rectifier Corporation), an Rbs having a resistance value of about 1 Ohm worked satisfactorily.

A second current limiting element, Re2, is preferably included in series with the substrate diode, Dsub. It is preferred that Re2 be located in between −Hv and the Vso terminal of the high voltage driver circuit as shown; however, other suitable locations for Re2 exist for example, between the Vb terminal of the high voltage driver circuit and the junction of Dbs and Cbs.

Re2 is preferably chosen such that Re2·Cbs>>t1, where t1 is the period of time when the current is ramping up in D2 at the rate of di/dt. It is noted, however, that Re2 has an upper limit which is dictated by the gate drive timing requirement of Q2 during normal operation. In the application using the IRPT2056C high voltage gate driver circuit, an Re2 having a resistance value of about 2 Ohms worked satisfactorily.

Figure 3A:
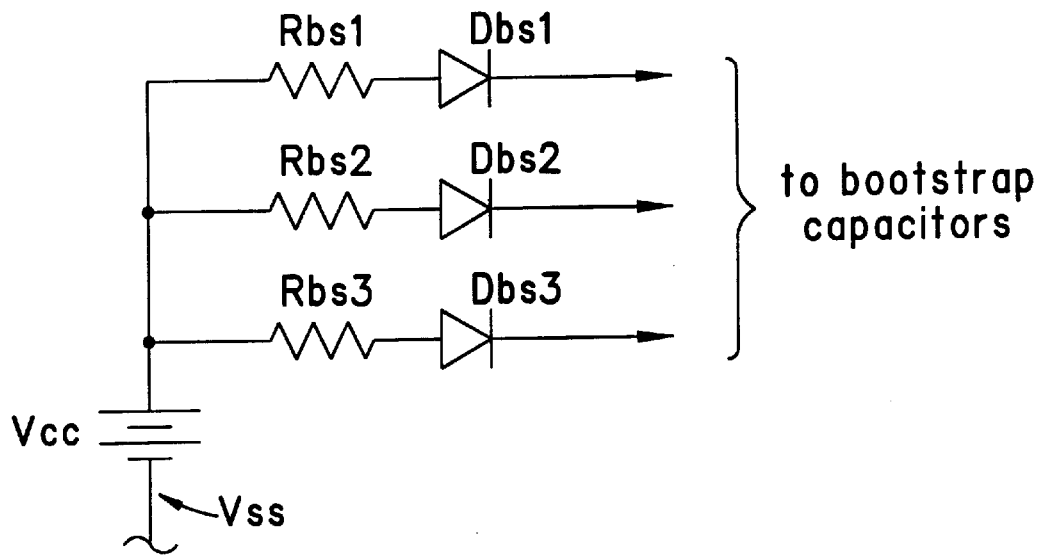
FIG. 3a is a schematic diagram showing one embodiment of the present invention capable of use in a power circuit which includes multiple bootstrap circuits.
Figure 3B:
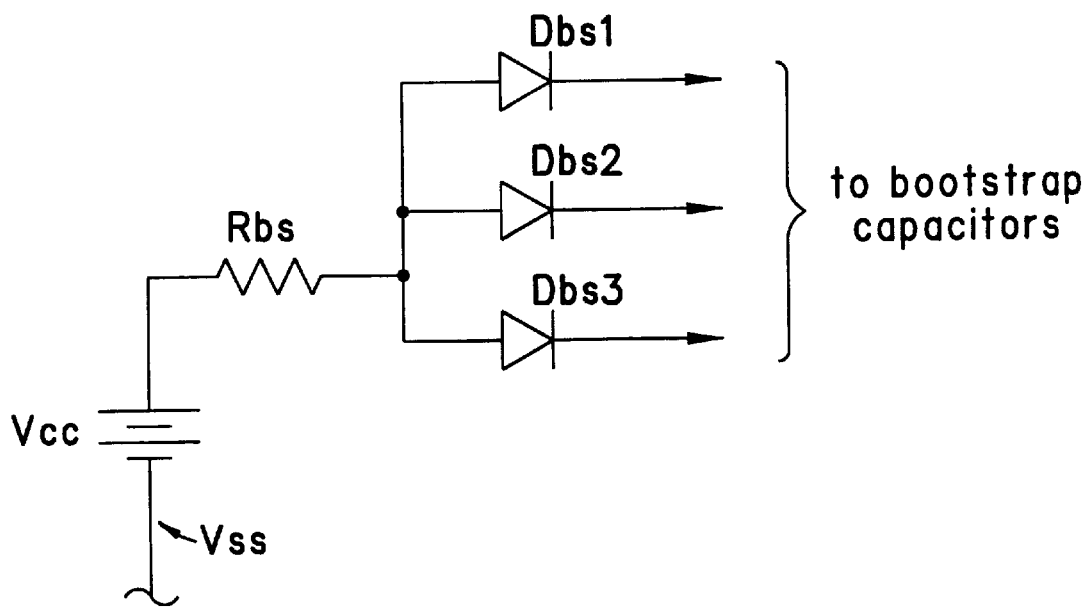
FIG. 3b is a schematic diagram showing an alternate embodiment of the present invention capable of use in a power circuit which includes multiple bootstrap circuits.

With reference to FIGS. 3a, there may be a plurality (e.g., three) bootstrap circuits being supplied by a common Vcc supply. In such a case, a plurality of current limiting elements Rbs1, Rbs2, Rbs3, etc. may be coupled in series with a plurality of bootstrap diodes Dbs1, Dbs2, Dbs3, etc., respectively. Alternatively, as shown in FIG. 3b, a single current limiting element Rbs may be coupled to a fanned configuration of bootstrap diodes Dbs1, Dbs2, Dbs3, etc., where the diodes are each coupled to the Rbs element at their anodes. The current limiting elements of FIGS. 3a or 3b may be used, for example, in a three phase bridge circuit shown in FIG. 4. The circuit of FIG. 4 basically represents three circuits of FIG. 2 coupled together.

Advantageously, the power conversion circuit employing the current limiting elements of the preferred embodiment of the present invention limits the substrate current Isub, thereby improving the immunity of the circuit to voltage spikes which develop across stray inductances. Similarly, power conversion circuits in accordance with the present invention have higher immunity to di/dt rates which enable use of larger IGBTs for higher power ratings. In addition, the present invention allows for using the bootstrap power supply, Vcc, in combination with a high side driver resulting in lower costs and circuit size reductions.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power circuit, comprising:
   at least one high side MOS gated transistor;
   at least one low side MOS gated transistor coupled in series with the high side MOS gated transistor operable to form a bridge circuit across high and low power terminals of a power source;
   a high side driver circuit having an output operable to change conduction characteristics of the high side MOS gated transistor;
   a series coupled diode and capacitor configured in a bootstrap arrangement with the high side and low side transistors to provide an operating voltage to the high side driver circuit;

a low side driver circuit having an output operable to change conduction characteristics of the low side MOS gated transistor;

a low side voltage source coupled to the low side driver circuit to provide an operating voltage thereto, the series coupled diode and capacitor being in series with the low side voltage source;

a stray inductance located in series with the high side and low side MOS gated transistors and inducing a current through the low side MOS gated transistor in response to conduction changes in the high side and low side MOS gated transistors;

a first current limiting element coupled in series between the low side voltage source and the diode to reduce a component of the induced current from the stray inductance from flowing through the diode into the capacitor;

a second current limiting element operable to be coupled in series between the low power terminal and the low side voltage source to reduce a component of the induced current from the stray inductance from flowing through the diode into the capacitor.

2. The power circuit of claim 1, wherein the first current limiting element is a first resistor.

3. The power circuit of claim 2, wherein the a induced current from the stray inductance has a time duration, the first resistor has a resistance, the capacitor has a capacitance, and the product of the resistance and the capacitance is substantially greater than the time duration.

4. The power circuit of claim 2, wherein the resistor has a resistance of about 1 ohm.

5. The power circuit of claim 1, wherein the second current limiting element is a resistor.

6. The power circuit of claim 5, wherein the induced current from the stray inductance has a time duration, the second resistor has a resistance, the capacitor has a capacitance, and the product of the resistance and the capacitance is substantially greater than the time duration.

7. The power circuit of claim 5, wherein the resistor has a resistance of about 2 ohms.

8. A power circuit, comprising:

at least one high side MOS gated transistor;

at least one low side MOS gated transistor coupled in series with the high side MOS gated transistor operable to form a bridge circuit across high and low power terminals of a power source;

a high side driver circuit having an output operable to change conduction characteristics of the high side MOS gated transistor;

a series coupled diode and capacitor configured in a bootstrap arrangement with the high side and low side transistors to provide an operating voltage to the high side driver circuit;

a low side driver circuit having an output operable to change conduction characteristics of the low side MOS gated transistor;

a low side voltage source coupled to the low side driver circuit to provide an operating voltage thereto, the series coupled diode and capacitor being in series with the low side voltage source;

a substrate diode coupled between the low side and high side driver circuits, a cathode of the substrate diode being connected to the junction of the diode and the capacitor;

a stray inductance located in series with the high side and low side MOS gated transistors and inducing a current through the low side MOS gated transistor in response to conduction changes in the high side and low side MOS gated transistors;

a first current limiting element coupled in series between the low side voltage source and the diode to reduce a component of the induced current from the stray inductance from flowing through the diode into the capacitor;

a second current limiting element operable to be coupled in series between the low power terminal and the low side voltage source to reduce a component of the induced current from the stray inductance from flowing through the diode into the capacitor; and a third current limiting element coupled in series from the low power terminal to the substrate diode to reduce a component of the induced current from the stray inductance from flowing through the substrate diode into the capacitor.

9. The power circuit of claim 8, wherein the first current limiting element is a first resistor.

10. The power circuit of claim 9, wherein the induced current from the stray inductance has a time duration, the first resistor has a resistance, the capacitor has a capacitance, and the product of the resistance and the capacitance is substantially greater than the time duration.

11. The power circuit of claim 9, wherein the resistor has a resistance of about 1 ohm.

12. The power circuit of claim 8, wherein the second current limiting element is a resistor.

13. The power circuit of claim 12, wherein the induced current from the stray inductance has a time duration, the second resistor has a resistance, the capacitor has a capacitance, and the product of the resistance and the capacitance is substantially greater than the time duration.

14. The power circuit of claim 12, wherein the resistor has a resistance of about 2 ohms.

15. A power circuit, comprising:

three high side MOS gated transistors;

three low side MOS gated transistors, each low side MOS gated transistor being coupled in series with respective ones of the high side MOS gated transistors operable to form three bridge circuits across high and low power terminals of a power source;

three high side driver circuits each having an output operable to change conduction characteristics of respective high side MOS gated transistors;

three pairs of series coupled diode and capacitor circuits arranged in respective bootstrap configurations with respective high side and low side transistor bridge circuits to provide respective operating voltages to the respective high side driver circuits;

three low side driver circuits each having an output operable to change conduction characteristics of the respective low side MOS gated transistors;

a low side voltage source coupled to the low side driver circuits to provide an operating voltage thereto, the respective series coupled diode and capacitor circuits being in series with the low side voltage source;

stray inductances, at least one stray inductance located in series with each high side and low side MOS gated transistor bridge circuit and inducing a current through the respective low side MOS gated transistor in response to conduction changes in the respective high side and low side MOS gated transistors;

a least one first current limiting element coupled in series between the low side voltage source and at least one diode to reduce a component of the induced current from a respective stray inductance from flowing through the diode into the respective capacitor;

a second current limiting elements operable to be coupled in series between the low power terminal and the low side voltage source to reduce a component of the induced current from respective stray inductances from flowing through the diode into the capacitor.

16. The power circuit of claim 15, further comprising:

three substrate diodes, one substrate diode being coupled between respective low side and high side driver circuits, respective cathodes of the substrate diodes being connected to respective junctions of the diodes and the capacitors; and three third current limiting elements, respective third current limiting elements being coupled in series from the low power terminal to respective substrate diodes to reduce respective components of the induced currents from the stray inductances from flowing through the substrate diodes into the respective capacitors.

17. The power circuit of claim 15, further comprising:

three first current limiting elements, respective first current limiting elements being coupled in series from the low side voltage source to respective diodes to reduce respective components of the induced currents from the stray inductances from flowing through the diodes into the respective capacitors.

* * * * *

UNITED STATES PATENT AND TRADEMARK OFFICE
CERTIFICATE OF CORRECTION

Figure 4:
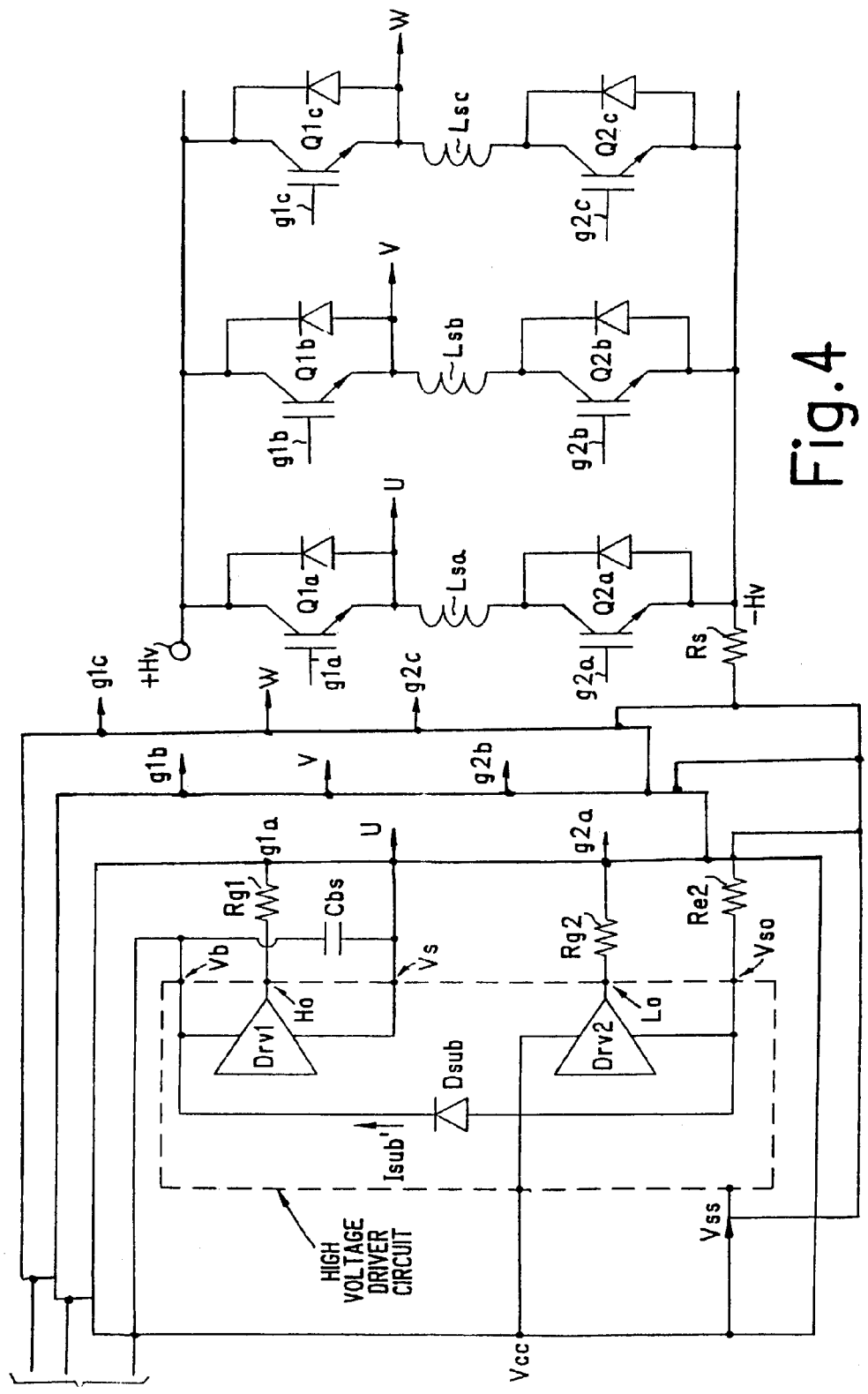
FIG. 4 is a schematic diagram of another embodiment of the present invention as used in a three phase bridge circuit.

PATENT NO. : 5,969,964
APPLICATION NO. : 09/063069
DATED : October 19, 1999
INVENTOR(S) : Vijay Mangtani It is certified that error appears in the above-identified patent and that said Letters Patent is hereby corrected as shown below:

IN THE DRAWINGS:

Add Fig. 4 to the drawings.

Signed and Sealed this

Seventeenth Day of October, 2006

JON W. DUDAS
*Director of the United States Patent and Trademark Office*